(12) United States Patent
Ohashi (10) Patent No.: US 6,316,971 B1
(45) Date of Patent: Nov. 13, 2001

(54) COMPARING AND AMPLIFYING DETECTOR CIRCUIT

(75) Inventor: Ikuo Ohashi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/397,279

(22) Filed: Sep. 16, 1999

(30) Foreign Application Priority Data

Sep. 18, 1998 (JP) .................................................. 10-263836

(51) Int. Cl.$^7$ .............................. H03K 5/22; H03K 5/153
(52) U.S. Cl. ................................ 327/74; 327/53; 327/66; 327/70; 327/512; 330/257
(58) Field of Search ...................... 327/53, 63, 66, 327/74, 72, 512, 83, 138, 362, 544–546, 333, 68, 70; 330/257, 253, 261; 326/80, 81

(56) References Cited

U.S. PATENT DOCUMENTS

| | | | |
|---|---|---|---|
| 4,047,059 | * | 9/1977 | Rosenthal ................................ 327/63 |
| 4,319,181 | | 3/1982 | Wrathall ................................ 327/324 |
| 4,323,854 | * | 4/1982 | Hester ................................ 327/512 |
| 4,441,041 | * | 4/1984 | Schroder ................................ 327/362 |
| 4,560,921 | | 12/1985 | Mineo ................................ 327/77 |
| 5,008,586 | | 4/1991 | Miyazaki et al. ..................... 323/315 |
| 5,214,316 | * | 5/1993 | Nagai ................................ 327/143 |
| 5,262,713 | | 11/1993 | Agiman ................................ 323/315 |
| 5,304,861 | | 4/1994 | Fruhauf et al. ..................... 327/512 |
| 5,336,943 | * | 8/1994 | Kelly et al. ........................... 327/512 |
| 5,614,872 | * | 3/1997 | Tagiri ................................ 327/143 |
| 5,719,533 | * | 2/1998 | Shibuya et al. ....................... 327/513 |
| 5,894,234 | * | 4/1999 | Morris ................................ 327/65 |
| 6,028,468 | * | 2/2000 | Menniti et al. ....................... 327/333 |

FOREIGN PATENT DOCUMENTS

| | | |
|---|---|---|
| 0523380 | 1/1993 | (EP) . |
| 5711525 | 1/1982 | (JP) . |
| 5-14073 | 1/1993 | (JP) . |
| 6-244414 | 9/1994 | (JP) . |

OTHER PUBLICATIONS

Patent Abstracts Of Japan, vol. 013, No. 050 (P–823), Feb. 6, 1989 & JP 63 243729 A (Toshiba Corp), Oct. 11, 1988, *abstract*.
Patent Abstracts Of Japan, vol. 018, No. 629 (E–1637), Nov. 30, 1994 & JP 06 244414 A (Hitachi Ltd), Sep. 2, 1994, *abstract*.

* cited by examiner

Primary Examiner—Terry D. Cunningham
Assistant Examiner—Long Nguyen
(74) Attorney, Agent, or Firm—Ostrolenk, Faber, Gerb & Soffen, LLP (57) ABSTRACT

A comparing detector circuit capable of operating regardless of input voltages thereto includes a first pair of transistors to which first and second input signal voltages are input for functioning as a buffer; a second pair of transistors constructing a current mirror circuit in which an input side and an output side are connected to the first pair of transistors via first and second resistors, respectively; and an output transistor to which potential at the output side of the current mirror circuit is applied as an input.

10 Claims, 12 Drawing Sheets

PRIOR ART

PRIOR ART

FIG. 13 (B)

PRIOR ART

COMPARING AND AMPLIFYING DETECTOR CIRCUIT

FIELD OF THE INVENTION

This invention relates to a comparing detector circuit and, more particularly, to a comparing and amplifying detector circuit for performing voltage comparison and amplification and detection of temperature. The invention further relates to a comparing and amplifying detector circuit ideal for use in a power MOSFET having an internal protection function.

BACKGROUND OF THE INVENTION

Figure 10:
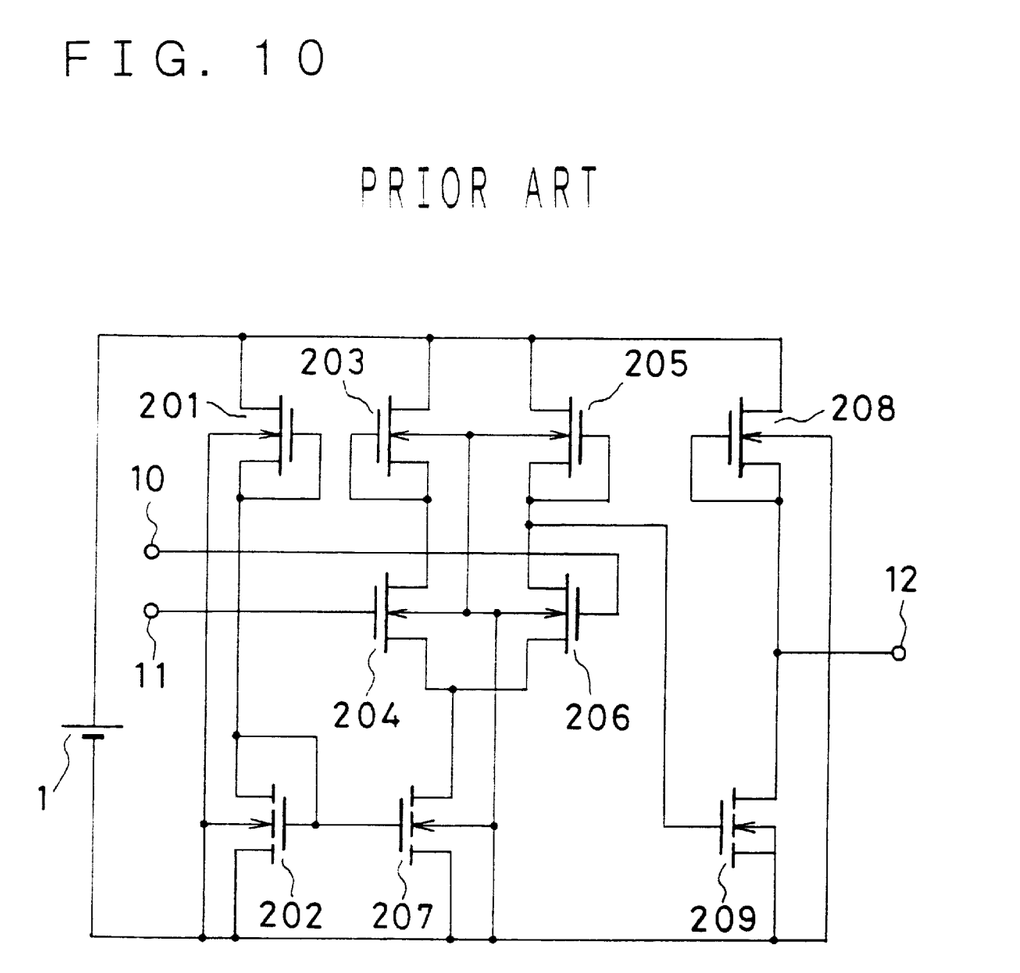
FIG. 10 is a circuit diagram showing a comparing and amplifying detector circuit according to the prior art.

A comparator of the kind disclosed in, e.g., the specification of Japanese Patent Kokai (Laid-Open) Publication JP-A-5-14073 has been proposed as a comparing and amplifying detector circuit in the prior art. The comparator, which uses a differential amplifier, employs depletion-type MOS transistors as amplifying elements and is adapted in such a manner that a digital signal is obtained even for an input voltage in the low-level range. FIG. 10 is a diagram showing a circuitry of the comparator disclosed in this publication. A constant current, which is obtained by a depression-type transistor 201 whose drain is connected to a power supply and whose gate and source are tied together, is input as a reference current to the input side of enhancement-type transistors 202, 207 that construct a current mirror circuit. An output current of the current mirror circuit is supplied as a driving current to transistors 204, 206 forming a differential pair and having sources that are tied together, gates to which input terminals 10, 11 are respectively connected and drains that are respectively connected to load elements (depletion-type transistors whose drains are connected to the power supply and each of whose gate and source are tied together) 203, 205. A drain of the transistor 206 is connected to the input of an inverter comprising a depletion-type transistor 208 and an enhancement-type transistor 209, namely to a gate of the transistor 209. A signal applied to this inverter is inverted and amplified thereby and output at an output terminal 12.

Figure 12:
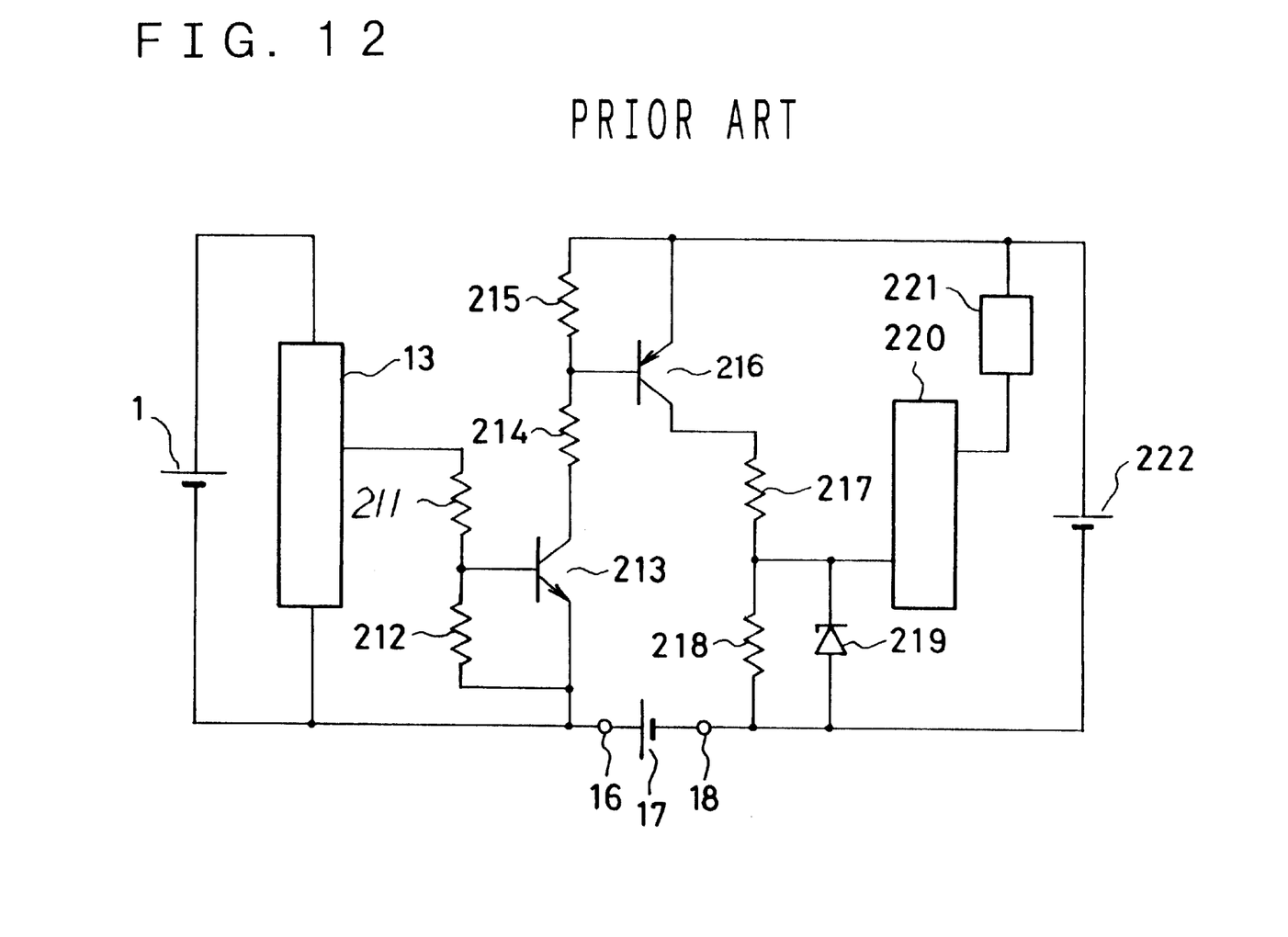
FIG. 12 is a circuit diagram showing the construction of another example of a comparing and amplifying detector circuit according to the prior art.

A circuit of the kind shown in FIG. 12 is known as a comparator used in electrical equipment in automobiles. The comparator has a power supply 1, a control IC 13 arranged on control ground 16; a battery 222, a low-side PID (intelligent power device) 220 and a load 221 arranged on power ground 18: interface resistors 211, 212, 214, 215, 217 and 218; transistors 213, 216; and a voltage regulator diode 219.

In the operation of the circuit shown in FIG. 12, the output voltage of the control IC 13 is potentially divided by the resistors 211, 212 and the resulting voltage is applied to the base of the NPN transistor 213. By turning the transistor 213 on and off, the PNP transistor 216 is turned on and off, the voltage of the battery 222 is clamped by the voltage regulator diode 219 and a signal is applied to an input of the low-side IPD 220.

Figure 13A:
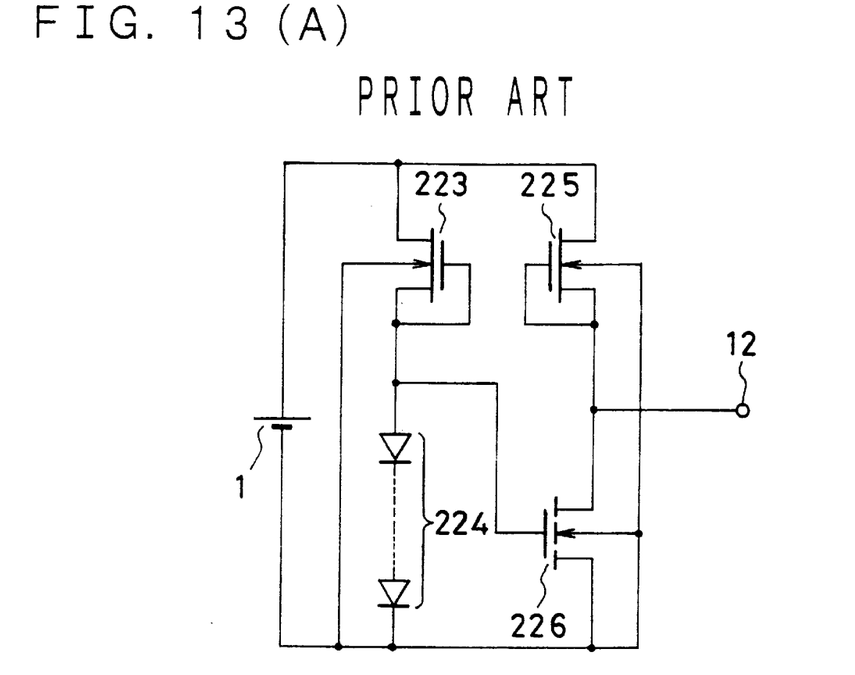
FIG. 13(A) is a circuit diagram showing the construction of another example of a comparing and amplifying detector circuit according to the prior art.
Figure 13B:
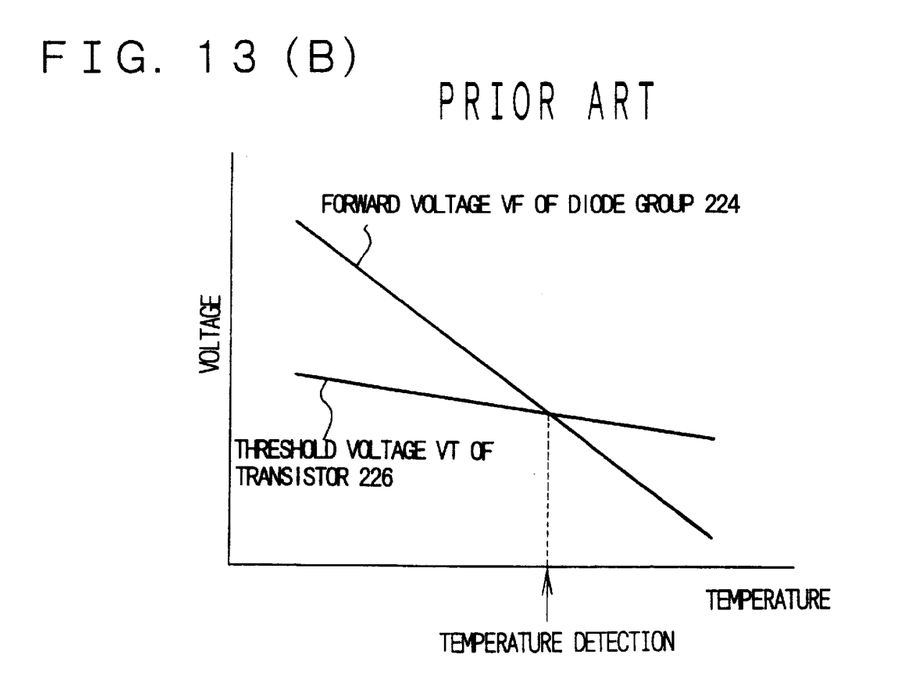
FIG. 13(B) is a graph useful in describing the operation of the circuit of FIG. 13(A).

The specification of Japanese Patent Kokai (Laid-Open) Publication JP-A-6-244414 discloses an arrangement serving as a temperature detector circuit in which, as shown in FIG. 13(A), a constant current obtained by a depletion-type transistor 223 flows into a diode group of serially connected diodes 224, and a potential at a connection node between the depletion-type transistor 223 and the diode group 224 is input to a gate of an enhancement-type transistor 226 and is compared with a threshold voltage VT of the transistor 226, whereby temperature is detected utilizing the temperature dependence illustrated in FIG. 13B.

SUMMARY OF THE DISCLOSURE

In the course of eager investigations toward the present invention, the following problems have been encountered.

The circuits according to the prior art set forth above have certain problems, described below.

The comparator depicted in FIG. 10 requires that threshold voltage VT of the transistor 209 be changed in conformity with the input voltages used. In the case of a semiconductor integrated circuit, therefore, an additional process for changing the threshold voltage VT of transistor 209 is necessary and the device has very little versatility.

Figure 11:
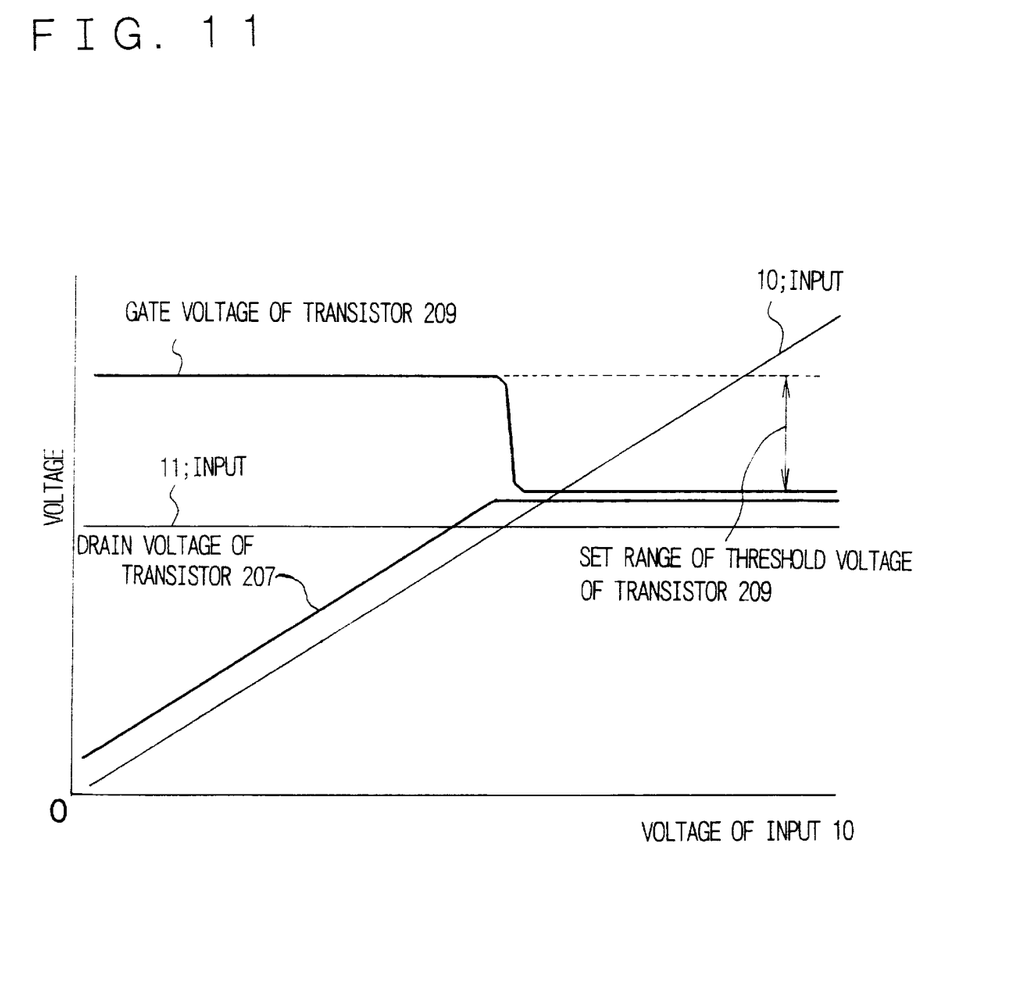
FIG. 11 is a characteristic diagram useful in describing the operation of the circuit shown in FIG. 10.

The reason for this is as follows:

Since the depletion-type transistors 203, 205 are both constant-current sources, the following inequality:

(current of transistors 203, 205)<(current of transistor 207)<(sum of currents of transistors 203 and 205)

is a condition for allowing a gate voltage of the transistor 209 to be changed with respect to inputs 10, 11. Consequently, as shown in FIG. 11, the depletion-type transistor 206 limits the current of the transistor 205 within the range:

(voltage of input 10)≦(voltage of input 11), and therefore the drain voltage of the transistor 207 becomes:
(voltage of input 10)−(threshold voltage VT of transistor 206), and the gate voltage of the transistor 209 becomes approximately the voltage of power supply 1.

Further, the depletion-type transistor 204 limits the current of the transistor 203 within the range:

(voltage of input 10)≧(voltage of input 11), and therefore the drain voltage of the transistor 204 becomes:
(voltage of input 11)−(threshold voltage VT of transistor 204), and the gate voltage of the transistor 209 becomes a voltage that is approximately the drain voltage of transistor 207.

Thus, the gate voltage of the transistor 209 ranges from the voltage of the power supply 1 to [(voltage of input 11)−(threshold voltage VT of transistor 204)].

In the circuit shown in FIG. 12, a resistance-containing transistor constituted by the resistors 211, 212 and transistor 213 and a resistance-containing transistor constituted by the resistors 214, 215 and transistor 216 are required between the control IC 13 and low-side IPD 220. This makes it difficult to miniaturize the device.

The reason for this is as follows:

The output voltage of the ordinary control IC 13 is $VOH \geq VDD \times 0.7$ $VOL \leq 0.3 \times VDD$ where VOH represents the high level of the output voltage and VOL the low level of the output voltage. Further, VDD is the voltage of the power supply 1, e.g., 5±0.5 V. When a fluctuating voltage 17 (e.g., ±1.5 V) between grounds is taken into account, the high and low levels of the control IC 13 cannot be discriminated from the low-side IPD 220.

A problem which arises with the circuit shown in FIG. 13(A) is a wide range of variation in detected temperature. The reason for this is as follows:

Let the temperature dependence of the forward voltage drop (VF) of diode group 224 be, e.g., 2 mV/° C.×5 stages=10 mV/° C., and let variation of the threshold voltage VT of transistor 226 be ±300 mV. Under these conditions, the range of variation in detected temperature will be ±300 mV÷10 mV/° C.=±30° C.

The present invention has been devised in view of the foregoing problems, and an object is to provide a comparator circuit that is capable of operating irrespective of the input voltages.

Another object of the present invention is to provide a comparing detector circuit that does not require resistor-containing transistors, thus making it possible to miniature devices having the circuit.

A further object of the present invention is to provide a detector circuit in which detection variance is reduced and precision improved.

According to a first aspect of the present invention, the foregoing objects are attained by providing a voltage comparator circuit comprising: a first pair of transistors to which first and second input signal voltages are input for functioning as a buffer; a second pair of transistors constructing a current mirror circuit in which an input node and an output node are connected to the first pair of transistors via first and second resistors, respectively; and an output transistor to which potential at the output node of the current mirror circuit is applied as an input.

According to a first variant to the first aspect, there is provided a voltage comparator circuit comprising: first and second current paths between a power supply and ground, the first current path including a first transistor, to which a first input signal is applied, and a first resistor, and the second current path including a second transistor, to which a second input signal is applied, and a second resistor; a current mirror circuit having an input node connected to the first resistor and an output node connected to the second resistor; and an output transistor to which a potential at the output node of the current mirror circuit is applied as an input.

The output from the output transistor is connected to an output terminal and to a load element, thereby constructing an inverting amplifying-type output circuit.

According to a second variant to the first aspect, there is provided a voltage comparator circuit comprising: first and second transistors, which construct a source follower, having gates to which first and second input signal voltages are respectively applied, and drains connected to a power supply; first and second resistors having one end connected to sources of the first and second transistors, respectively; third and fourth transistors constructing a current mirror circuit, the third transistor having a source connected to ground and a drain and a gate connected together and connected to the other end of the first resistor, and the fourth transistor having a source connected to ground, a drain connected to the other end of the second resistor and a gate commonly connected to the gate of the third transistor; a fifth transistor having a source connected to ground, a gate whose input is a drain potential of the fourth transistor, and a drain connected to an output terminal; and a load element connected between the power supply and the drain of the fifth transistor.

According to a third variant to the first aspect, there is provided a voltage comparator circuit comprising: first and second transistors, which construct an emitter follower, having bases to which first and second input signal voltages are respectively applied, and collectors connected to a power supply; first and second resistors having one end connected to emitters of the first and second transistors, respectively; third and fourth transistors constructing a current mirror circuit, the third transistor having an emitter connected to ground and a collector and a base connected together and connected to the other end of the first resistor, and the fourth transistor having an emitter connected to ground, a collector connected to the other end of the second resistor and a base commonly connected to a base of the third transistor; a fifth transistor having an emitter connected to ground, a base whose input is a collector a potential of the fourth transistor, and a collector connected to an output terminal; and a load element connected between the power supply and the collector of the fifth transistor.

According to a second aspect of the present invention, a comparing and amplifying detector circuit has first and second grounds of different potentials, wherein a first power supply on the first ground and a second power supply of the second ground are connected, and a first potential obtained by potentially dividing, by resistances, a potential between potential of the first power supply and output potential of a first control circuit connected between the first ground and the first power supply, and a second potential obtained by dividing, by resistances, a potential between the potential of the first power supply and potential of the first ground, are input to a voltage comparator.

As this voltage comparator the voltage comparator circuit described in any one of aforementioned aspect or variants may be used.

According to a third aspect of the present invention, a temperature detector circuit comprises: a first diode group of serially connected diodes; a second diode group of serially connected diodes; first load element and second load element forming load of current that flows into the first diode group and second diode group, respectively; and a voltage comparator whose inputs are potential at a node between the first diode group and the first load element and potential at a node between the second diode group and the second load element; the number of diodes in the first diode group being different from the number of diodes in the second diode group.

According to a variant to the third aspect, there is provided a temperature detector circuit comprising: a first diode group of serially connected diodes; a second diode group of serially connected diodes; first and second current sources for supplying currents to the first and second diode groups, respectively; and a voltage comparator whose inputs are a first potential at a node between the first diode group and the first current source and a second potential at a node between the second diode group and the second current source; wherein the number of diodes in the first diode group is different from the number of diodes in the second diode group.

The diode groups may be replaced by transistors each having a first resistor connected between an emitter and base and a second resistor connected between a base and collector.

The first and second current sources both may be comprised of depletion-type transistors.

According to a fourth aspect of the present invention, a temperature detector circuit has a first transistor, which constructs an input side of a current mirror circuit, connected to ground via a diode and to a power supply via a third transistor, which serves as an active load, and a first resistor; a second transistor, which constructs an output side of the current mirror circuit, connected to the power supply via a second resistor; and a voltage comparator to which the terminal potentials of the first and second resistors are applied as inputs.

According to a variant to the fourth aspect, there is provided a temperature detector circuit comprising: a first transistor, which constructs an input side of a current mirror circuit, connected to ground via a diode; a second transistor constructing an output side of the current mirror circuit; a third transistor, which serves as a current source, connected between a power supply and a common node of first and second resistors; the first and second transistors being connected to the first and second resistors, respectively; and a voltage comparator whose inputs are a first potential at a node between the first transistor and the first resistor and a second potential at a node between the second transistor and the second current resistor.

In the circuits according to third and fourth a aspects, or variants thereof the voltage comparator may be the voltage comparator described in any one of the first aspect and its variants.

Other aspects, features and advantages of the present invention will be apparent from the entire disclosure including claims and the following description taken in conjunction with the accompanying drawings, in which like reference characters designate the same or similar parts throughout the figures thereof.

Any features of the claims, which are not explicitly recited in the description are incorporated herein by reference to any of the claims, upon necessity.

PREFERRED EMBODIMENTS OF THE INVENTION

Preferred modes of practicing the present invention will now be described.

Figure 1:
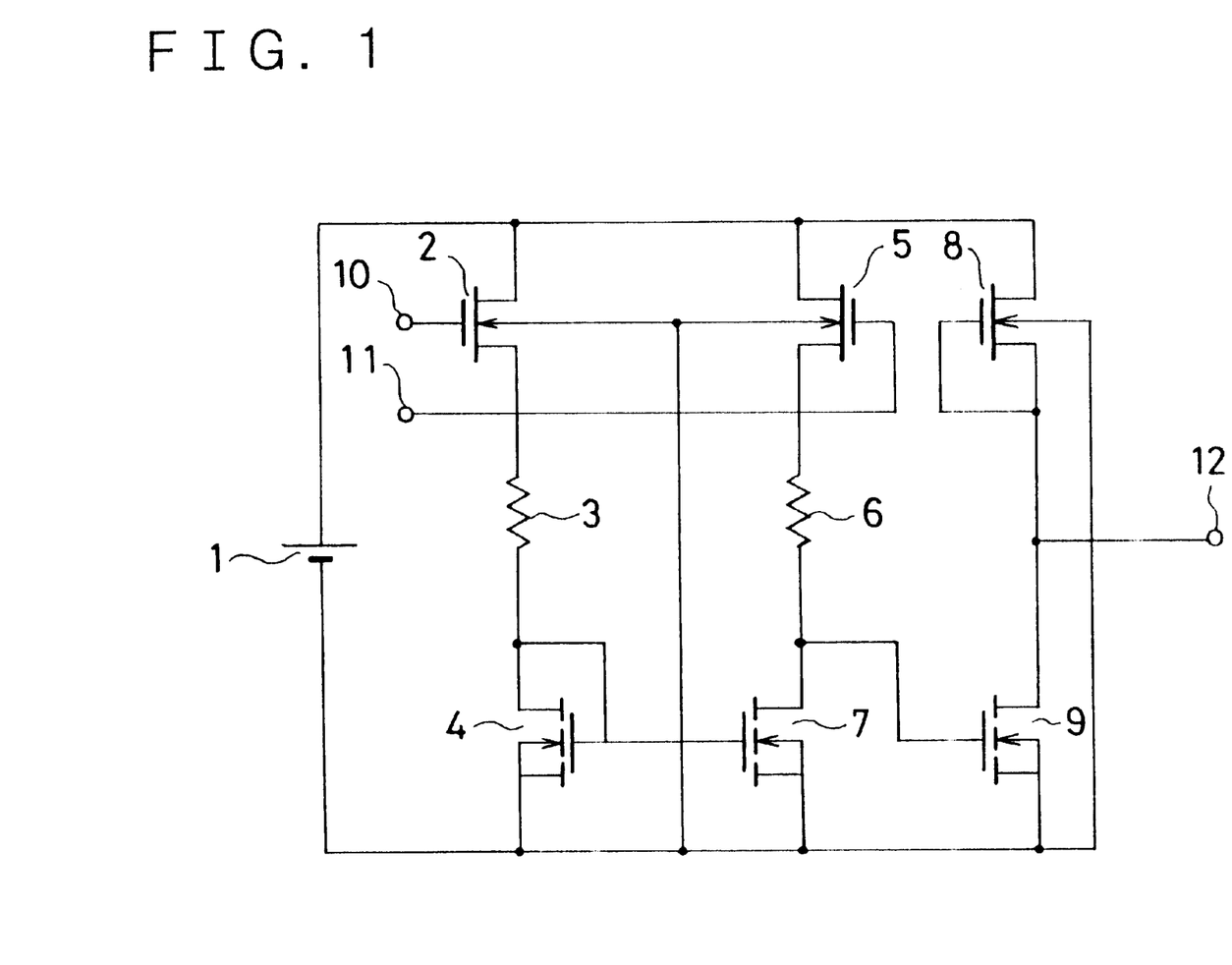
FIG. 1 is a circuit diagram showing the construction of a first embodiment of the present invention.

According to one aspect of the present invention, as shown in FIG. 1, the sum of (a difference voltage between first and second input voltages) and (threshold voltage VT of a transistor 4) is applied to a gate of an output transistor 9 whose threshold voltage is VT, whereby the difference voltage between the input voltages is directly super imposed on the threshold voltage VT so that the output is turned on and off or the input voltage difference amplified irrespective of the absolute values of the input voltages.

This voltage comparator comprises transistors 2, 5 constructing a buffer circuit (a source follower) to which the input voltages are applied, transistors 4, 7 constructing a current mirror circuit, resistors 3, 6 connected between the outputs of the buffer circuit (the sources of the transistors) and the input and output sides of the current mirror circuit, and the transistor 9 for turning the output of the device on and off, or for amplifying the difference between the input voltages.

A current 10 flows into the transistor 4 on the input side of the current mirror circuit. The current 10 is equal to:

[(voltage at input 10)−(threshold voltage VT of transistor 2)−(threshold voltage VT of transistor 4)]/(resistance value of resistor 3).

A current of the same current value flows into the transistor 7 on the output side of the current mirror circuit.

A voltage is applied to the transistor 9 as its gate voltage. This voltage is equal to [(voltage at input 11)−(threshold voltage VT of transistor 5)−(resistance value of resistor 6×10)]. By adopting identical characteristics for the transistors 2 and 5, for the resistors 3 and 6 and for the transistors 4 and 7 (e.g., by matching the channel widths W, channel lengths L or W/L ratios of the transistors and by adopting identical sizes, or example, of the resistors), the gate voltage of the transistor 9 becomes equal to:

[(voltage at input 10)−(voltage at input 11)+(threshold voltage VT of transistor 4).

Thus the output of the device can be turned on and off, or the difference between the input voltages can be amplified, irrespective of the absolute values of the input voltages.

Figure 2:
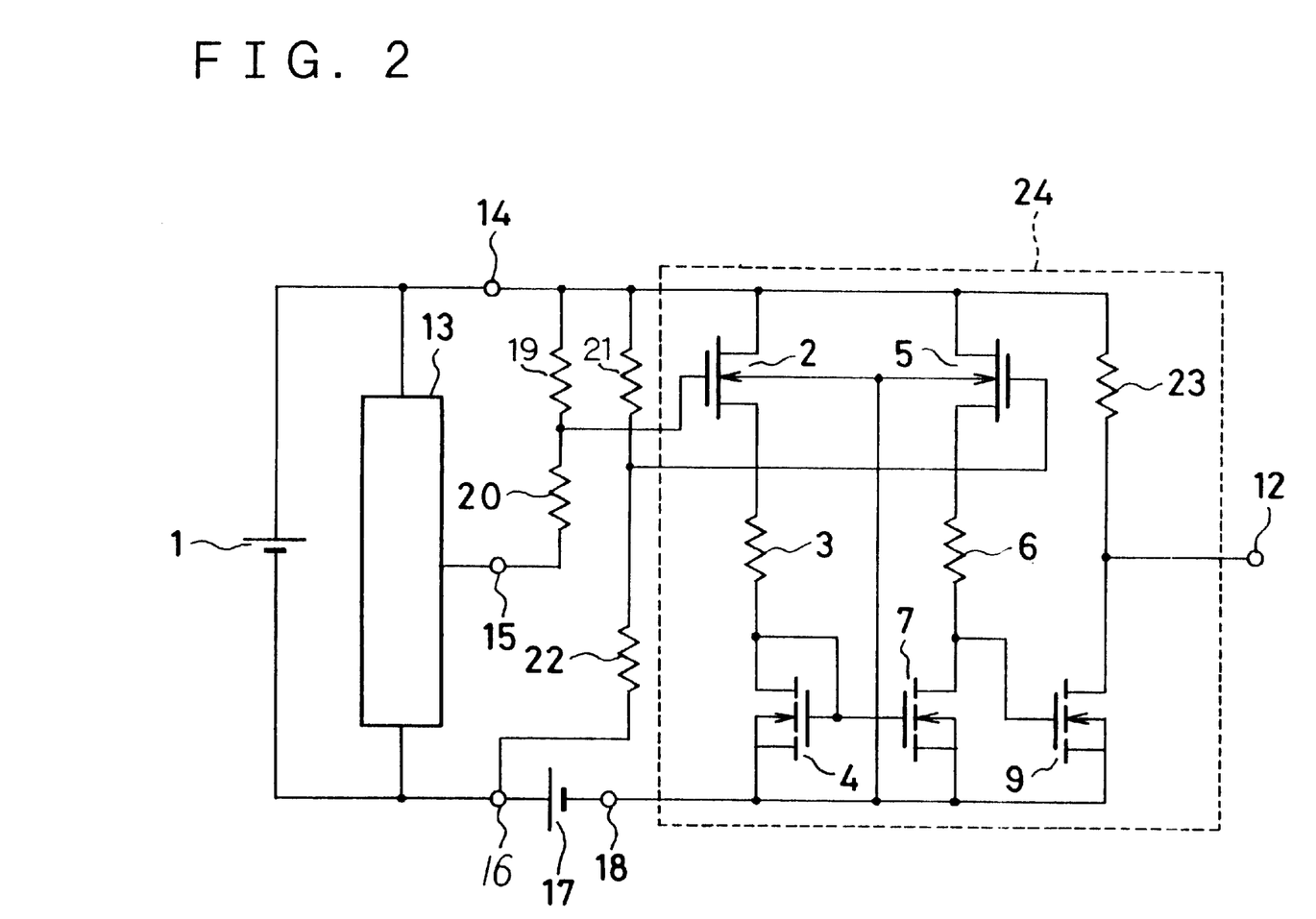
FIG. 2 is a circuit diagram showing the construction of a second embodiment of the present invention.

According to another aspect of the present invention, the output voltage of a control IC and the voltage at control ground are pulled up and the voltages are compared by a comparator. More specifically, as shown in FIG. 2, the device has a resistor or transistor 19 and a resistor 20 for pulling output voltage 15 of a control IC up toward the power supply voltage; a resistor or transistor 21 and a resistor 22 for pulling up the voltage of ground; and a comparator 24.

The relationship between the voltage at the control output terminal 15 and control ground 16 is independent of a fluctuating voltage 17 between grounds. Accordingly, two voltages which are obtained by potentially dividing both voltages across these nodes 15, 16 and a power supply terminal 14 by the resistors 19, 20, 21, 22, are compared by the comparator 24. Alternatively, a constant-current source using depression-type transistors or the like is constructed in place of the resistors 19, 21, the constant-current source is used to pull up both voltages by constant voltages and the resulting voltages are compared by the comparator 24.

A circuit constructed in a semiconductor integrated circuit device exhibits little dependence upon the absolute value of the transistor threshold voltage VT because relative-value variation is much smaller than absolute-value variation and absolute-value variation of diodes is small. More specifically, as shown in FIG. 3, the circuit has transistors 101, 103 for supplying relative current values, i.e., a current ratio, diode groups 102, 104 for varying terminal voltage in response to temperature, and the comparator 24 for detecting a difference in voltage variation.

Figure 6:
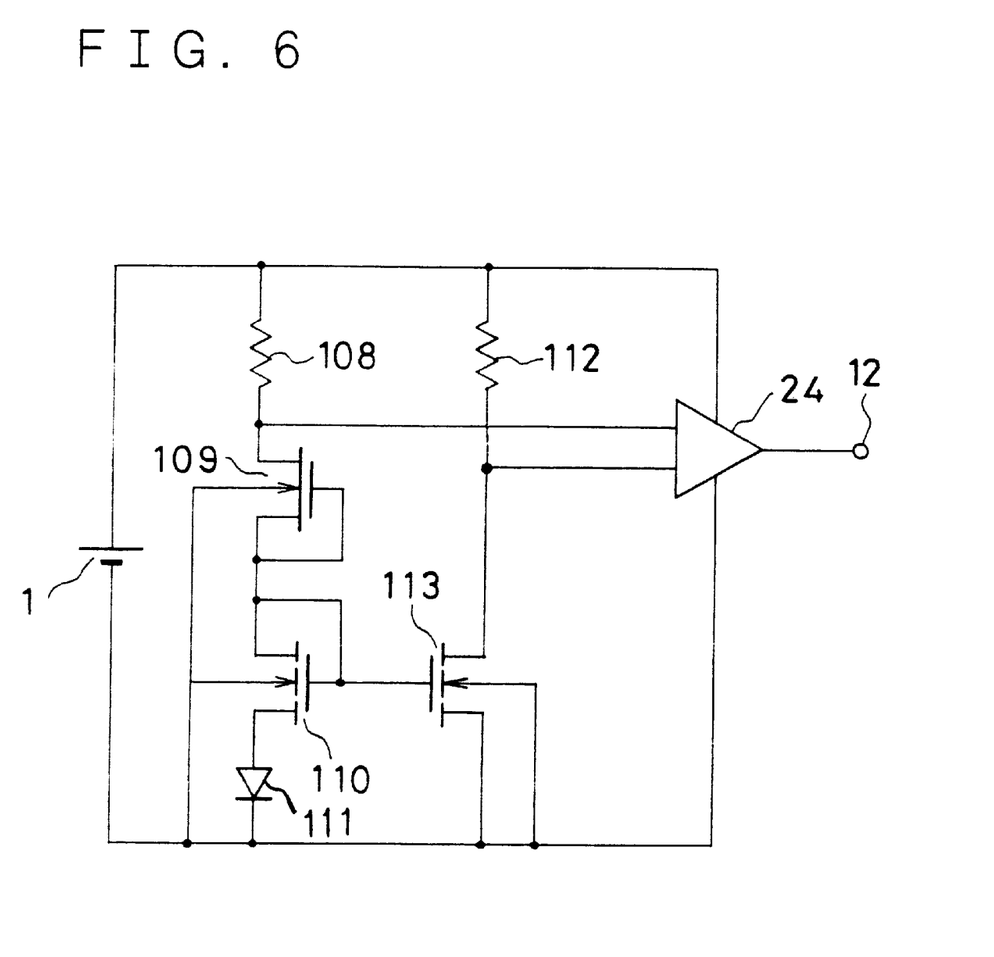
FIG. 6 is a circuit diagram showing the construction of a fourth embodiment of the present invention.
Figure 7:
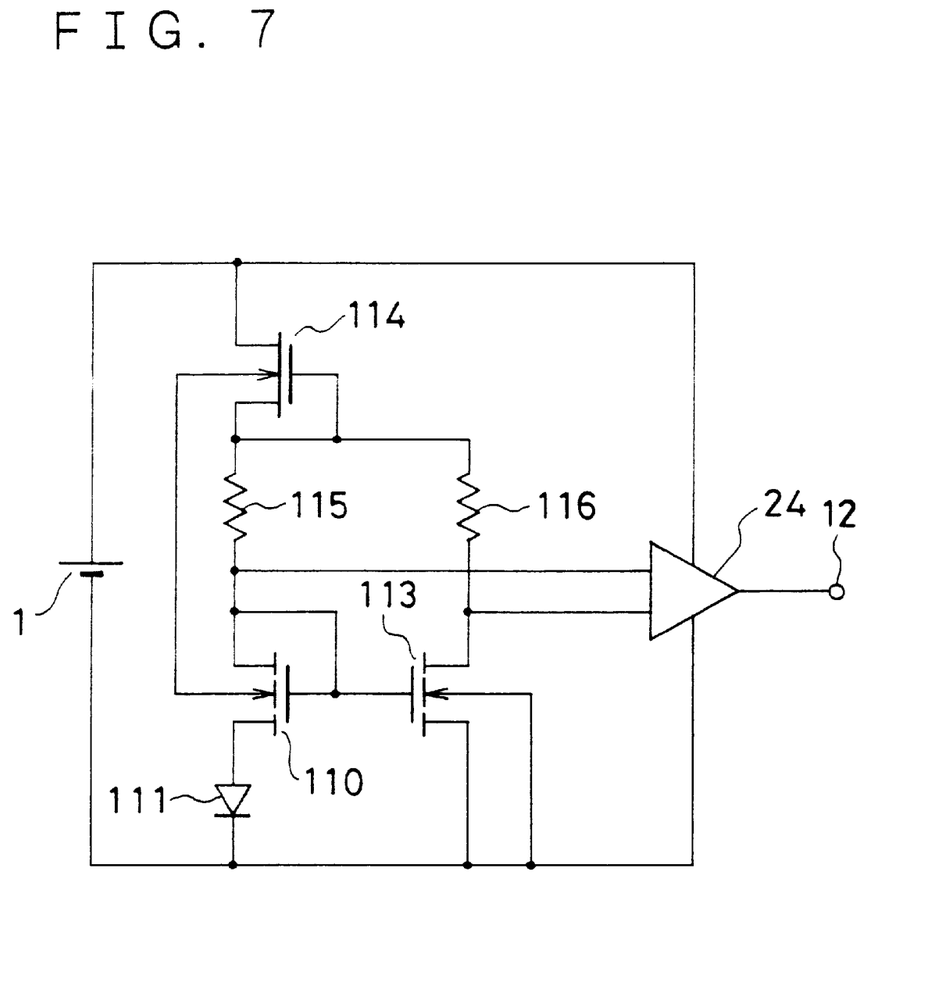
FIG. 7 is a circuit diagram showing another example of construction of the fourth embodiment of the present invention.

Alternatively according to a further aspect, as shown in FIGS. 6 and 7, the circuit has a diode 111 for varying terminal voltage in response to temperature, a current mirror circuit 110, 113 for applying current amplification to the variation in voltage, resistors 108, 112 (FIG. 6) and 115, 116 (FIG. 7) for changing the variation in current to voltage, and the comparator 24.

Figure 3:
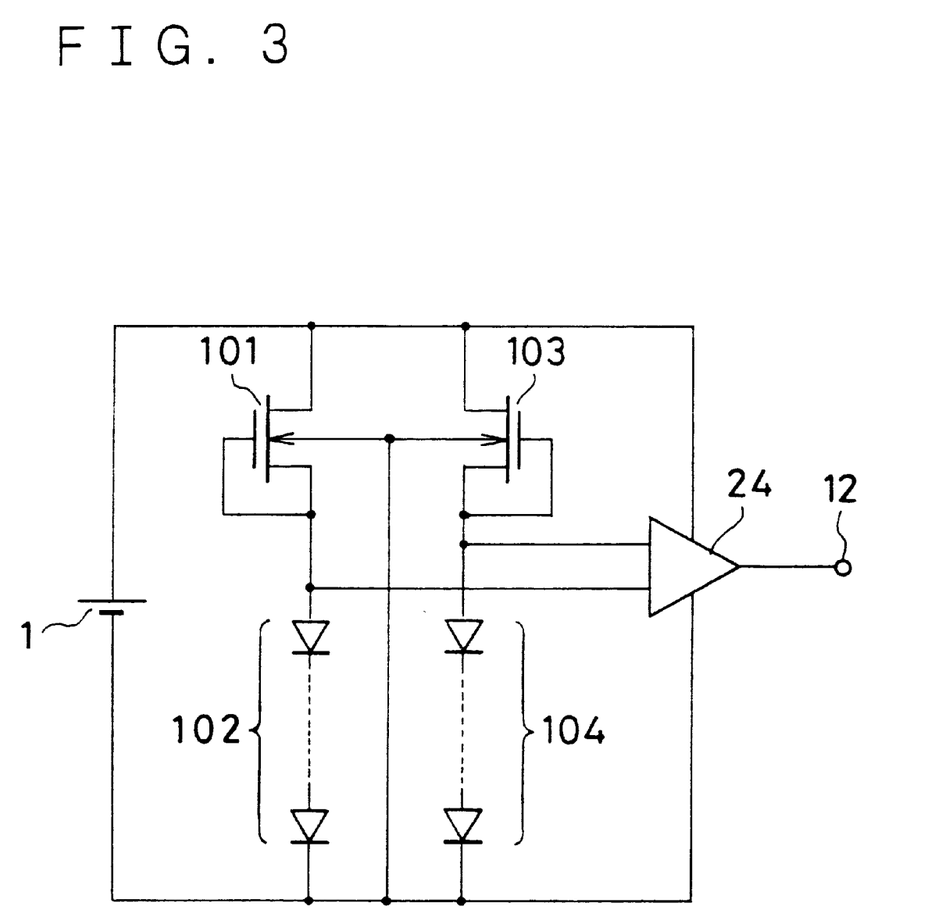
FIG. 3 is a circuit diagram showing the construction of a third embodiment of the present invention.
Figure 5:
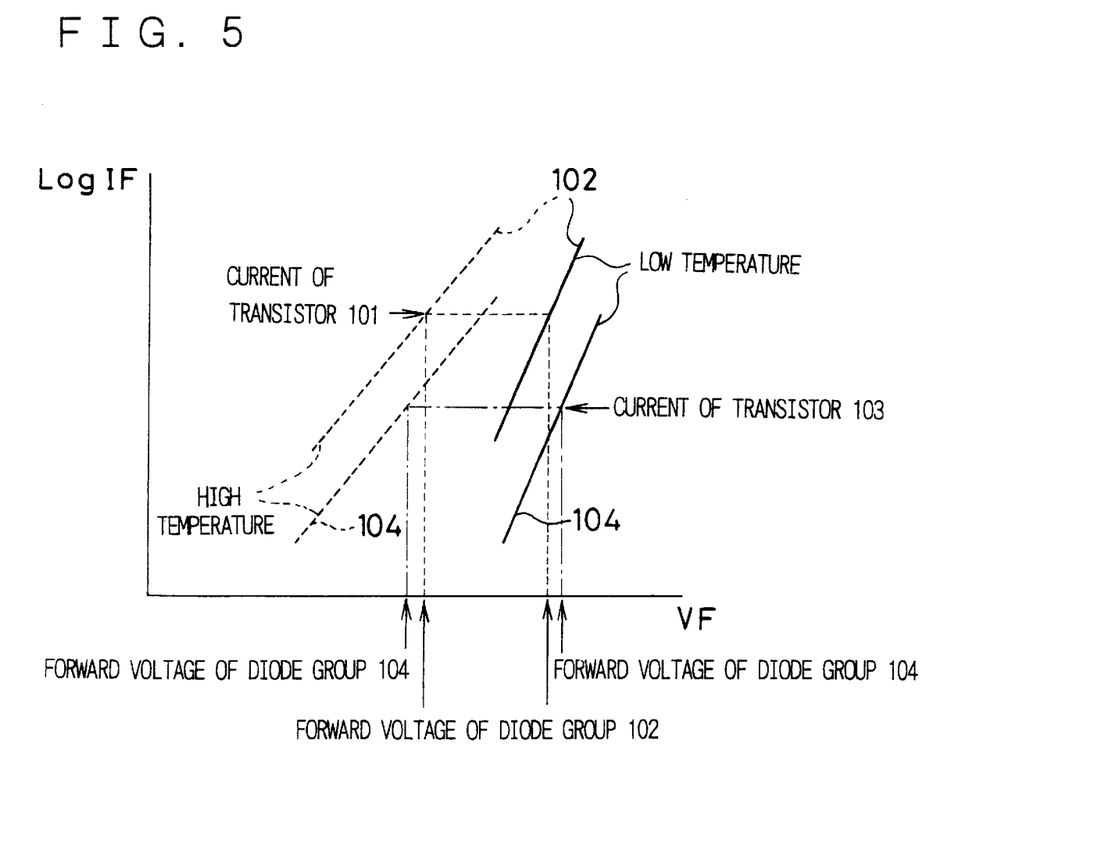
FIG. 5 is a characteristic diagram useful in describing the operation of the third embodiment.

A large constant current resulting from the depletion-type transistor 101 in FIG. 3 is applied to the diode group 102, the number of diodes of which is small, and a small constant current resulting from the depletion-type transistor 103 is applied to the diode group 104, the number of diodes of which is large. As a result, temperature is sensed utilizing a disparity in temperature dependence due to current, as illustrated in FIG. 5.

Alternatively, identical constant currents are applied to the diode group 102 of the smaller number of diodes and to the diode group 104 of the larger number of diodes and large junction area, whereby temperature is sensed utilizing a disparity in temperature dependence due to current.

Alternatively, current amplification by the current mirror circuit 110, 113 in FIGS. 6 and 7 is varied by the diode 111, whose terminal voltage varies in response to temperature, and changes in voltage across the resistors 108, 112 (FIG. 6) and 115, 116 (FIG. 7), which are for changing current variation to voltage, are detected by the comparator 24.

DETAILED DESCRIPTION OF THE EMBODIMENTS

Embodiments of the present invention will now be described with reference to the drawings in order to explain further the modes of the invention set forth above.

FIG. 1 is a circuit diagram showing the construction of a voltage comparator embodying the present invention. As shown in FIG. 1, the voltage comparator according to this embodiment comprises transistors 2, 5 whose drains are connected to the power supply and whose gates are connected to input terminals 10, 11, respectively; resistors 3, 6 having one end connected to transistors 2, 5, respectively; transistor 4 whose drain and gate are connected to the other end of the resistor 3 and whose source is grounded; transistor 7 whose drain is connected to the other end of the resistor 6, whose gate is connected to the gate of the transistor 4 and whose source is grounded; transistor 9 whose source is grounded and whose gate is connected to a node at which the drain of the transistor 7 and the resistor 6 are connected; and transistor 8 whose gate and source are tied together and connected to the drain of the transistor 9, and whose drain is connected to the power supply. The drain of the transistor 9 is connected to output terminal 12. The transistors 4 and 7 construct a current mirror circuit, and the transistor 8 constitutes the load of the transistor 9.

Letting VIN10 represent the input voltage at input terminal 10, VT2, VT4 the threshold voltages of the transistors 2, 4, and R3 the resistance value of the resistor 3, we have $$I0 = (VIN10 - VT2 - VT4)/R3 \tag{1}$$

which represents the current that flows into the transistor 4 on the input side of the current mirror circuit. Letting VIN11 represent the input voltage at input terminal 11, VT5 the threshold voltage of the transistor 5, and R6 the resistance value of the resistor 6, we have $$VG9 = VIN11 - VT5 - (R6 \times I0) \tag{2}$$

which represents the voltage applied as the gate voltage of the transistor 9.

By adopting identical characteristics for the transistor 2 and 5, for the resistors 3 and 6 and for the transistors 4 and 7 (as by matching width and length etc.), the threshold voltages of the transistors 2 and 5 become equal (VT2=VT5=VT), the resistance values of the resistors 3 and 6 become equal (R3=R6=R), and the gate voltage of transistor 9 becomes as follows:

$$VG9 = VIN11 - VT - (R) \times \{VIN10 - VT - VT4\}/R\}) \tag{3}$$

$$= VIN10 - VIN11 + VT4$$

Accordingly, by adopting identical characteristics (as by matching width and length etc.) for the transistors 4 and 7, with the threshold voltage of transistor 9 being VT, the transistor 9 can turn the output 12 on and off or can amplify and output the input voltage difference (VIN10–VIN11) regardless of the absolute values of the input voltages.

It should be noted that as for the resistors 3 and 6, it is sufficient if the both would have identical characteristics. Thus there is no limitation upon resistance elements, and the transistors 2, 5 may be enhancement-type transistors or bipolar transistors.

Further, the transistors 4, 7, 9 may be MOSFETs or bipolar transistors, and the transistor 8 may be a depression-type resistor or may be replaced by a resistor as far as it functions as the same load.

Furthermore, if the voltage drops across the resistors 3 and 6 are identical, it will suffice if the resistance ratio between the resistors 3 and 6 is approximately the reciprocal of the mirror ratio of the current mirror circuit (the ratio of the current drive capability of the output transistor 7 to that of the input transistor 4; the emitter-area ratio in the case of bipolar transistors; the ratio between the W/L ratios in the case of MOS transistors).

For example, if the transconductance parameter of the transistor 7 is N times that of the transistor 4, the resistance value R6 of resistor 6 and the resistance value R3 of resistor 3 will be related as follows: R6/R3=1/N.

FIG. 2 is a circuit diagram illustrating the construction of a second embodiment of the present invention. As shown in FIG. 2, this embodiment has power supply 1, control IC 13 arranged on control ground 16; resistors 19, 20 connected between power supply terminal 14 and control output terminal 15 of control IC 13; resistors 21, 22 connected between power supply terminal 14 and control ground; and comparator 24, whose power source is power ground 18 and power supply terminal 14 and whose inputs are the potential obtained by potential division using resistors 19, 20 (at a node between 19 and 20) and the potential obtained by potential division using resistors 21, 22 (at a node between 21 and 22). The comparator 24 is identical with that of the embodiment shown in FIG. 1.

Letting VDD represent the voltage of power supply 1, VO the voltage at control output terminal 15 and R19, R20, R21 and R22 the resistance values of the resistors 19, 20, 21 and 22, respectively, the voltage obtained by potentially dividing the voltage across the power supply terminal 14 and control output terminal 15 by the resistors 19, 20 is given by the following, with control ground 16 serving as the reference:

$$VDD \times R20/(R19+R20) + V \times R19/(R19+R20)$$

and the voltage obtained by potentially dividing the voltage across the power supply terminal 14 and control ground 16 by the resistors 21, 22 is given by the following:

$VDD \times R22/(R21+R22)$

The difference between both voltages, therefore, which is unrelated to the fluctuating voltage 17 between grounds, is detected by the comparator 24.

It should be noted that a constant-current source using depletion-type transistors or the like may be constructed in place of the resistors 19, 21, the constant-current source may be used to pull up the voltages at the control output terminal 15 and control ground 16 by constant voltages based upon the product of the resistance of resistor 20 or 22 and each constant-current value, and the resulting voltages may be compared by the comparator 24.

In case where the resistors are used, the difference between two inputs of the comparator becomes smaller than the voltage difference between the control output terminal 15 and the control ground 16. However, if the constant current source is used, the input's difference is identical to the difference between the control output terminal 15 and the control ground 16, thus, the comparator output is I little influenced by the performance of the comparator 24.

In order to produce the depletion-type transistors however, additional manufacturing steps will be required. Accordingly, the selection can be made based upon the construction of the overall semiconductor IC device.

It should be noted that the comparator 24 is not limited to the construction shown above and that a voltage comparator having a different construction may be used.

FIG. 3 is a circuit diagram showing the construction of a temperature detector according to a third embodiment of the present invention. According to this embodiment, as shown in FIG. 3, the temperature detector has depletion-type transistors 101, 103 whose drains are connected to the power supply and whose gates are connected to their sources; diode groups 102, 104 connected to the sources of the depletion-type transistors 101, 103, respectively; and comparator 24 for comparing the two inputs thereto, namely the potential at the node at which the depletion-type transistor 101 and diode group 102 are connected and the potential at the node at which the depletion-type transistor 103 and diode group 104 are connected. The number of diodes in the diode group 102 is smaller than the number of diodes in the diode group 104. The comparator 24 has a construction identical with that of the embodiment shown in FIG. 1.

A large constant current resulting from the depletion-type transistor 101 in FIG. 3 is applied to the diode group 102 of the smaller number of diodes, and a small constant current resulting from the depletion-type transistor 103 is applied to the diode group 104 of the larger number of diodes. As a result, temperature is sensed utilizing a disparity in temperature dependence due to current, as illustrated in FIG. 5.

Alternatively, identical constant currents are applied to the diode group 102 of the smaller number of diodes and to the diode group 104 of the larger number of diodes and large junction area, whereby temperature is sensed utilizing a disparity in temperature dependence due to current.

Figure 4:
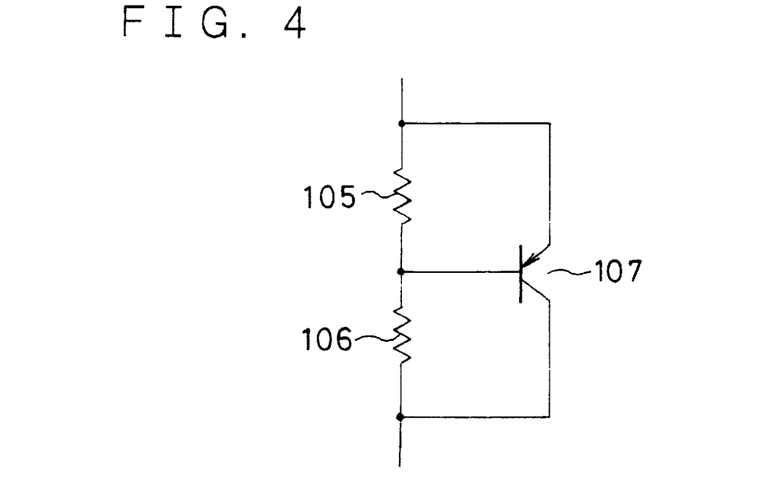
FIG. 4 is a circuit diagram showing another example of construction of the third embodiment of the present invention.

In a modification of this embodiment, as shown in FIG. 4, the diode groups 102, 104 may be replaced by an arrangement in which resistors 105, 106 are connected between the emitter and base and between the base and collector of a transistor 107. Let VBE represent the voltage across the emitter and base of the transistor 107, R105 and R106 the resistance values of the resistors 105 and 106, respectively, and VF the forward voltage drop across the diodes. By arranging it so that the following relation holds:

$VBE = VF \times (R105+R106)/R105$ it becomes possible to effect a setting to any value, whereas a setting only to a whole-number multiple of the forward voltage drop VF of the diodes can be achieved with the circuit of FIG. 3.

Thus, taking into account the fact that relative-value variation is much smaller than absolute-value variation and absolute-value variation of diodes is small in a semiconductor integrated circuit device, a circuit exhibiting little dependence upon the absolute value of the transistor threshold voltage VT is constructed, thereby making it possible to achieve a range of detected-temperature variation on the order of, say, about ±9° C., whereas the range is about ±32° C. with the prior-art temperature detector circuit shown in FIG. 13(A), inclusive of variation other than that of the absolute value of threshold voltage VT.

FIG. 6 is a circuit diagram showing the construction of a fourth embodiment of the present invention. This temperature detector according to the fourth embodiment comprises diode 111 whose cathode is grounded; enhancement-type transistor 110 whose source is connected to the anode of the diode 111 and whose drain and gate are connected; depletion-type transistor 109, whose source and gate are connected to the drain of the transistor 110; resistor 108 connected between the drain of the transistor 109 and the power supply; enhancement-type transistor 113 whose source is grounded and whose gate is tied to the gate of the transistor 110; resistor 112 connected between the drain of the transistor 113 and the power supply; and comparator 24, whose two inputs are the potential at a node at which the resistor 108 and transistor 109 are connected and the potential at a node at which the resistor 112 and transistor 113 are connected.

The constant current of the depletion-type transistor 109 is supplied to the resistor 108, enhancement-type transistor 110 and diode 111, the sum of the threshold voltage VT of transistor 110 and forward voltage drop VF of diode 111 is applied to the gate of the enhancement-type transistor 113, the drain current of transistor 113, which conforms to the gate voltage thereof, is applied to the resistor 112, and the terminal voltages of the resistors 108, 112 are compared by the comparator 24.

Figure 8:
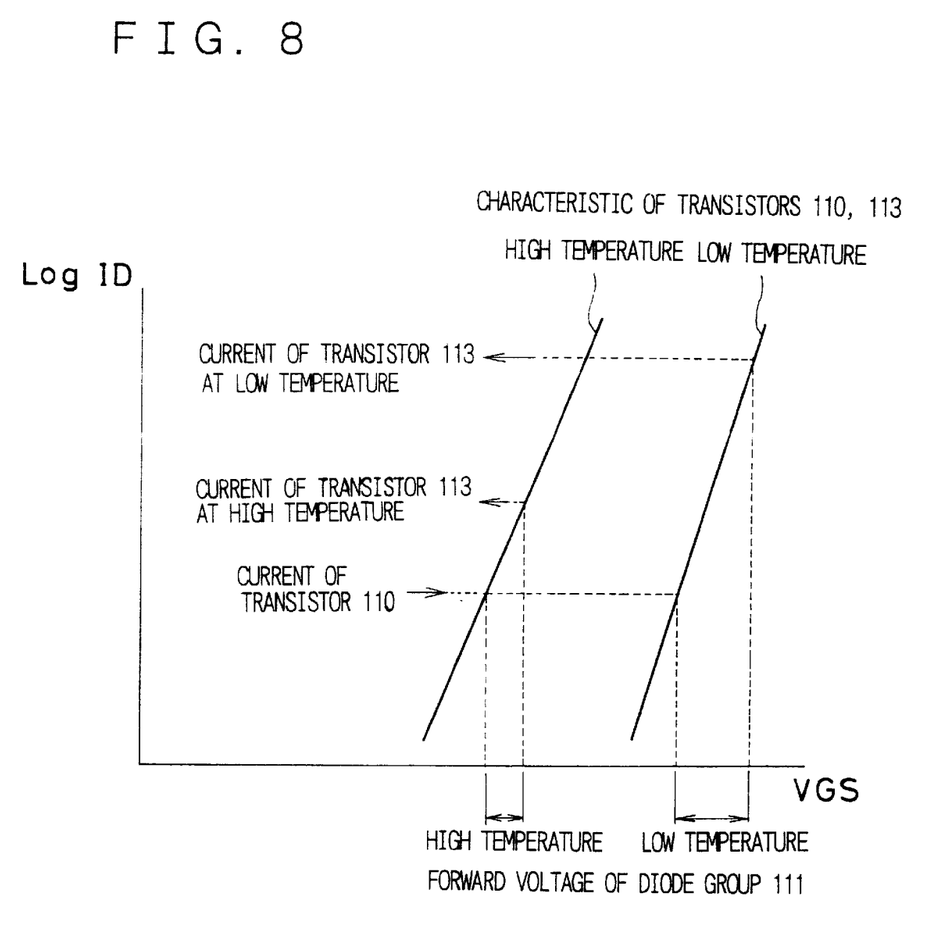
FIG. 8 is a characteristic diagram useful in describing the operation of the fourth embodiment.

When temperature varies, the voltage impressed upon the gate of the transistor 113 changes mainly owing to the temperature-induced change in the forward voltage drop VF of the diode 111, as illustrated in FIG. 8, and the ratio of the current of transistor 110 to the current of transistor 113 changes. By making the current ratio at which temperature is desired to be sensed the ratio of the resistance value of resistor 112 to the resistance value of resistor 108, temperature can be sensed by the comparator 24.

FIG. 7 is a circuit diagram showing a modification of the construction of the fourth embodiment. As shown in FIG. 7, a constant current resulting from the depletion-type transistor 114 is split between a path comprising resistor 115, transistor 110 and diode 111 and a path comprising resistor 116 and transistor 113. When temperature varies, the voltage impressed upon the gate of the transistor 113 changes mainly owing to the temperature-induced change in the forward voltage drop VF of the diode 111, as illustrated in FIG. 8, and the ratio of the current of transistor 110 to the current of transistor 113 changes. This is similar to the arrangement shown in FIG. 6.

By making the current ratio at which temperature is desired to be sensed the ratio of the resistance value of resistor 116 to the resistance value of resistor 115, temperature can be sensed by the comparator 24.

In accordance with this embodiment, it is possible to achieve a range of detected-temperature variation on the order of, say, ±24° C., whereas the range is ±32° C. with the prior-art temperature detector circuit shown in FIG. 13(A), inclusive of variation other than that of the absolute value of threshold voltage VT. Though the range of detected-temperature variation is broader than in the case of FIG. 3, the number of diodes can be reduced, thus making it possible to further miniaturize the semiconductor IC device.

Figure 9:
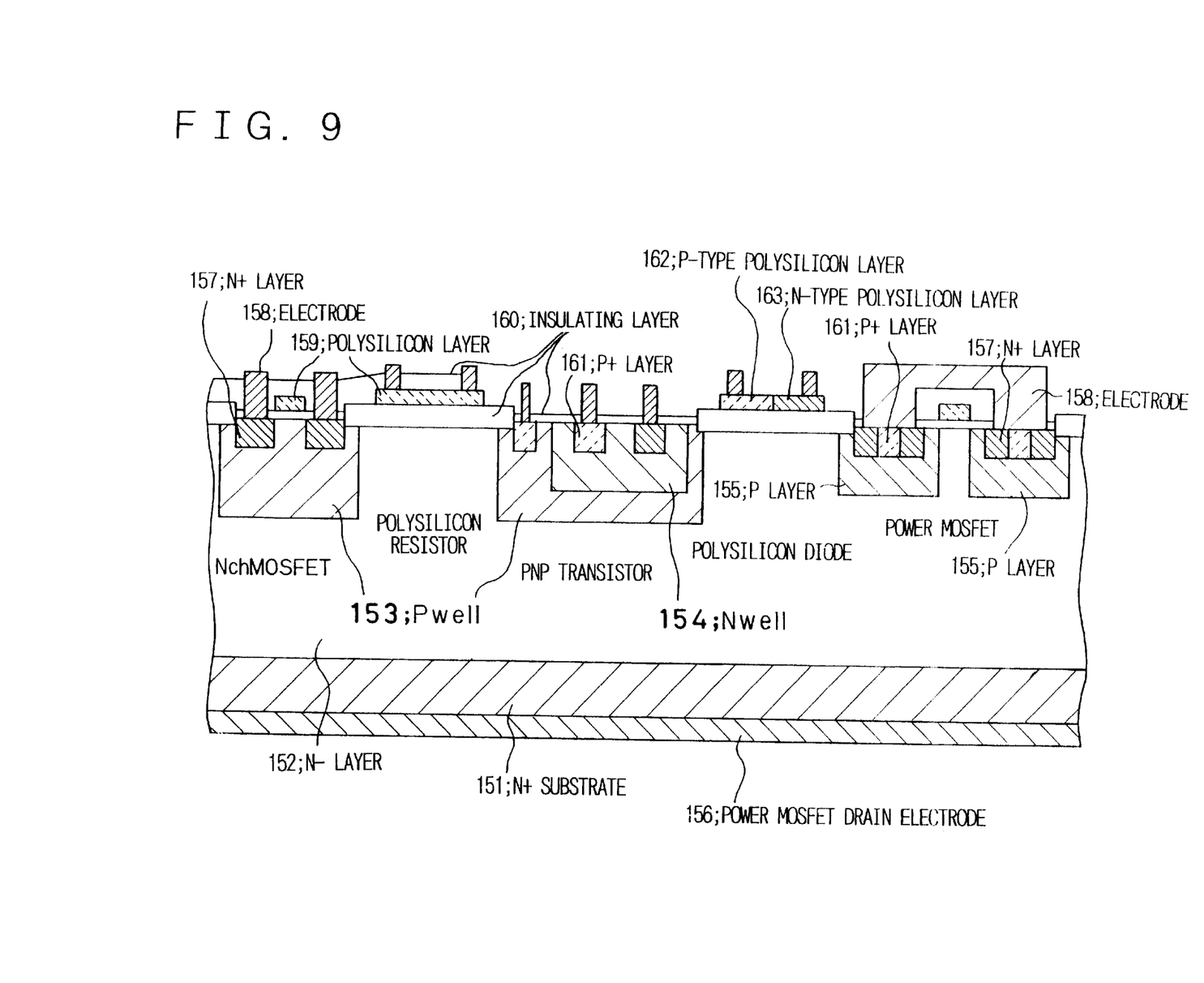
FIG. 9 is a sectional view showing an example of an arrangement in a case where the present invention is created in a semiconductor device.

FIG. 9 is a diagram showing the construction of a fifth embodiment of the present invention. This illustrates an example of the cross section of a semiconductor substrate in a case where any of the circuits shown in FIGS. 1, 2, 3 and 6 are fabricated on a chip. As shown in FIG. 9, the device comprises an N− layer 152, P wells 153, an N well 154, a P layer 155, an N+ layer 157, electrodes 158, a polysilicon layer 159, insulating layers 160, a P+ layer 161, a P-type polysilicon layer 162 and an N-type polysilicon layer 163. As shown in FIG. 9, an N-channel MOSFET, a polysilicon resistor, a PNP transistor, a polysilicon diode and a power MOSFET are constructed.

In the arrangement of FIG. 9, the transistor is constituted by an N-channel MOSFET, the resistor by a polysilicon resistor and the diode by a polysilicon diode. This illustrates an example of a power MOSFET with an internal protection function. By changing the N type to P type and the P type to N type in FIG. 9, the device can be constructed by a P-channel MOSFET and NPN transistor used in the case of a P-channel power MOSFET. Further, the arrangement need not be one in which the power MOSFET is provided on the same substrate. Further, each device may be constructed on an insulating layer or in a single crystal underlying an insulating layer.

In accordance with the present invention, as described above, the following advantages are obtained:

The first advantage is that output can be turned on and off or a difference between input voltages amplified irrespective of the absolute values of input voltages.

The reason for this is that, according to the present invention, the sum of a difference voltage between two input voltages and threshold voltage VT of a transistor (4 in FIG. 1) is applied to the gate of an output transistor (9 in FIG. 1) whose threshold voltage is VT, whereby the difference voltage between the input voltages is directly superimposed on the threshold voltage VT so that the output is turned on and off or the input voltage difference amplified irrespective of the absolute values of the input voltages.

The second advantage of the present invention is that transistors with an internal resistance are no longer required, thus making it possible to miniaturize the device.

The reason for this is that, according to the present invention, the output voltage of a control IC and the voltage at control ground are pulled up and the voltages are compared by a comparator. As a result, high and low levels of the control IC can be discriminated from the side of power ground without using transistors having an internal resistance.

A third advantage of the present invention is that the range over which detected temperature exhibits variance can be reduced.

The reason for this is that relative-value variation is much smaller than absolute-value variation and absolute-value variation of diodes is small. In the present invention, it is possible to construct a circuit that is little affected by the absolute value of transistor threshold voltage.

As many apparently widely different embodiments of the present invention can be made without departing from the spirit and scope thereof, it is to be understood that the invention is not limited to the specific embodiments thereof except as defined in the appended claims.

It should be noted that other aspects and objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A comparing and amplifying detector circuit comprising:

first and second grounds of different potentials;

first and second power supplies on said first and second grounds, respectively, said first and second power supplies being connected;

a control circuit connected between said first ground and said first power supply;

first and second resistance elements for obtaining a first potential by potentially dividing a potential between a potential of said first power supply and an output potential of said control circuit;

third and fourth resistance elements for obtaining a second potential by potentially dividing a potential between the potential of said first power supply and the potential of said first ground; and a voltage comparator to which said first and second potentials are applied as inputs.

2. The circuit according to claim 1, wherein said voltage comparator comprises:

a first pair of transistors to which first and second input signal voltages are input for functioning as a buffer;

a second pair of transistors defining a current mirror circuit in which an input node and an output node are connected to said first pair of transistors via first and second resistors, respectively; and an output transistor to which potential at the output node of the current mirror circuit is applied as an input;

wherein said first pair of transistors said second pair of transistors and said output transistor are of the same type.

3. The circuit according to claim 1, wherein said voltage comparator comprises:

first and second current paths between said first power supply and said first ground, said first current path including a first transistor, to which a first input signal is applied, and a first resistor, and said second current path including a second transistor, to which a second input signal is applied, and a second resistor;

a current mirror circuit having an input node connected to said first resistor and an output node connected to said second resistor; and an output transistor to which a potential at the output node of said current mirror circuit is applied as an input;

wherein said first transistor, said second transistor and said output transistor are of the same type.

4. The circuit according to claim 1, wherein said voltage comparator comprises:

first and second transistors, defining a source follower, having gates to which first and second input signal voltages are respectively applied, and drains connected to said first power supply;

first and second resistors having one end connected to sources of said first and second transistors, respectively;

third and fourth transistors defining a current mirror circuit, said third transistor having a source connected to said first ground and a drain and a gate connected together and connected to the other end of said first resistor, and said fourth transistor having a source connected to said first ground, a drain connected to the other end of said second resistor and a gate commonly connected to the gate of said third transistor;

a fifth transistor having a source connected to said first ground, a gate having an input that is a drain potential of said fourth transistor, and a drain connected to an output terminal; and a load element connected between said first power supply and the drain of said fifth transistor;

wherein said first transistor said second transistor, said third transistor, said fourth transistor and said fifth transistor are of the same type.

5. The circuit according to claim 1, wherein said voltage comparator comprises:

first and second transistors, defining an emitter follower, having bases to which first and second input signal voltages are respectively applied, and collectors connected to said first power supply;

first and second resistors having one end connected to emitters of said first and second transistors, respectively;

third and fourth transistors defining a current mirror circuit, said third transistor having an emitter connected to said first ground and a collector and a base connected together and connected to the other end of said first resistor, and said fourth transistor having an emitter connected to said first ground, a collector connected to the other end of said second resistor and a base commonly connected to a base of said third transistor;

a fifth transistor having an emitter connected to said first ground, a base having an input that is a collector potential of said fourth transistor, and a collector connected to an output terminal; and a load element connected between said first power supply and the collector of said fifth transistor;

wherein said first transistor, said second transistor, said third transistor, said fourth transistor and said fifth transistor of the same type.

6. The circuit according to claim 1, wherein said second and third resistance elements are constituted by depletion-type transistors.

7. A temperature detector circuit comprising:

a first transistor, defining an input side of a current mirror circuit, connected to a ground via a diode and to a power supply via a third transistor, which serves as a current source, and a first resistor;

a second transistor, defining an output side of said current mirror circuit, connected to the power supply via a second resistor; and a voltage comparator to which terminal potentials of said first and second resistors are applied as inputs.

8. The circuit according to claim 7, wherein said voltage comparator comprises:

first and second transistors, defining a source follower, having gates to which first and second input signal voltages are respectively applied, and drains connected to the power supply;

first and second resistors having one end connected to sources of said first and second transistors, respectively;

third and fourth transistors defining a current mirror circuit, said third transistor having a source connected to a ground and a drain and a gate connected together and connected to the other end of said first resistor, and said fourth transistor having a source connected to the ground, a drain connected to the other end of said second resistor and a gate commonly connected to the gate of said third transistor;

a fifth transistor having a source connected to the ground a gate having an input that is a drain potential of said fourth transistor, and a drain connected to an output terminal; and a load element connected between the power supply and the drain of said fifth transistor;

wherein said first transistor, said second transistor, said third transistor, said fourth transistor and said fifth transistor are of the same type.

9. A temperature detector circuit comprising:

a first transistor, defining an input side of a current mirror circuit, connected to a ground via a diode;

a second transistor defining an output side of said current mirror circuit;

a third transistor, which serves as a current source, connected between a power supply and a common node of first and second resistors;

said first and second transistors being connected to the first and second resistors, respectively, and a voltage comparator having inputs that are a first potential at a node between said first transistor and said first resistor and a second potential at a node between said second transistor and said second resistor.

10. The circuit according to claim 9, wherein said voltage comparator comprises:

first and second transistors, defining an emitter follower, having bases to which first and second input signal voltages are respectively applied, and collectors connected to a power supply;

first and second resistors having one end connected to emitters of said first and second transistors, respectively;

third and fourth transistors defining a current mirror circuit, said third transistor having an emitter connected to a ground and a collector and a base connected together and connected to the other end of said first resistor, and said fourth transistor having an emitter connected to the around, a collector connected to the other end of said second resistor and a base commonly connected to a base of said third transistor;

a fifth transistor having an emitter connected to the ground, a base having an input that is a collector potential of said fourth transistor, and a collector connected to an output terminal; and a load element connected between the power supply and the collector of said fifth transistor;

wherein said first transistor, said second transistor, said third transistor, said fourth transistor and said fifth transistor of the same type.

* * * * *